(12) United States Patent
Maloberti et al.

(10) Patent No.: US 11,251,806 B2
(45) Date of Patent: Feb. 15, 2022

(54) BINARY WEIGHTED CURRENT SOURCE AND DIGITAL-TO-ANALOG CONVERTER

(71) Applicant: Microtera Semiconductor (Guangzhou) Co., Ltd., Guangdong (CN)

(72) Inventors: Franco Maloberti, Guangdong (CN); Alper Akdikmen, Guangdong (CN); Bin Dai, Guangdong (CN); Linsen Shi, Guangdong (CN); Sen Liu, Guangdong (CN)

(73) Assignee: Microtera Semiconductor (Guanzhou) Co., Ltd., Guangzhou (CN)

( * ) Notice: Subject to any disclaimer, the term of this patent is extended or adjusted under 35 U.S.C. 154(b) by 0 days.

(21) Appl. No.: 17/133,580

(22) Filed: Dec. 23, 2020

(65) Prior Publication Data
US 2022/0021397 A1    Jan. 20, 2022

(30) Foreign Application Priority Data
Jul. 20, 2020 (CN) .......................... 202010695794.3

(51) Int. Cl.
*H03M 1/66* (2006.01)
*H03M 1/74* (2006.01)

(52) U.S. Cl.
CPC .................................. *H03M 1/745* (2013.01)

(58) Field of Classification Search
CPC ........ H03M 1/785; H03M 1/747; H03M 1/68; H03M 1/363; H03M 1/66; H03M 1/76; H03M 1/74; H03M 1/745; H03M 1/808; H03M 1/06; H03M 1/0612; H03M 1/687; H03M 1/46

USPC .......................................................... 341/144
See application file for complete search history.

(56) References Cited

U.S. PATENT DOCUMENTS

| 3,978,473 A | * | 8/1976 | Pastoriza | H03M 1/747 341/145 |
| 4,168,528 A | * | 9/1979 | Comer | H03M 1/745 327/334 |
| 4,292,625 A | * | 9/1981 | Schoeff | H03M 1/74 341/145 |
| 9,065,462 B1 | * | 6/2015 | Kakamu | H03M 1/00 |

(Continued)

FOREIGN PATENT DOCUMENTS

| CN | 1614662 A | 5/2005 |
| CN | 1864116 A | 11/2006 |

(Continued)

*Primary Examiner* — Linh V Nguyen

(57) ABSTRACT

The present disclosure provides a binary weighted current source and a digital-to-analog converter, which include: a driving voltage generating circuit, generating a driving voltage based on a preset current; a current dividing circuit, connected to an output terminal of the driving voltage generating circuit; a current steering circuit, connected to the current dividing circuit. The current dividing circuit divides the driving voltage through resistors in series, and drives each of a plurality of current output transistors to output a current in response to a voltage across the current output transistor. Currents output by the plurality of current output transistor are binary weighted currents, each two of the binary weighted currents have a binary relationship, and the binary weighted currents are produced by successive binary divisions of the preset current.

12 Claims, 2 Drawing Sheets

(56) References Cited

U.S. PATENT DOCUMENTS

| | | | |
|---|---|---|---|
| 10,840,894 B1* | 11/2020 | Hague | H03M 1/66 |
| 2004/0090356 A1* | 5/2004 | Sekiguchi | H03M 1/0648 |
| | | | 341/153 |
| 2006/0012501 A1* | 1/2006 | Lee | H03M 1/682 |
| | | | 341/144 |
| 2006/0114142 A1* | 6/2006 | Ohmi | H03M 1/687 |
| | | | 341/155 |
| 2010/0026540 A1* | 2/2010 | Morita | H03M 1/0614 |
| | | | 341/144 |
| 2010/0207967 A1* | 8/2010 | Baek | G09G 3/3685 |
| | | | 345/690 |
| 2010/0211364 A1 | 8/2010 | Mandal et al. | |
| 2013/0214953 A1* | 8/2013 | Shiraishi | H03M 1/66 |
| | | | 341/144 |
| 2017/0041018 A1* | 2/2017 | Kuo | H03M 1/664 |

FOREIGN PATENT DOCUMENTS

| | | |
|---|---|---|
| CN | 101013462 A | 8/2007 |
| CN | 101145783 A | 3/2008 |
| CN | 101796711 A | 8/2010 |
| CN | 102195654 A | 9/2011 |
| CN | 103376284 A | 10/2013 |
| CN | 104579350 A | 4/2015 |
| CN | 108471312 A | 8/2018 |
| CN | 111313900 A | 6/2020 |

\* cited by examiner

BINARY WEIGHTED CURRENT SOURCE AND DIGITAL-TO-ANALOG CONVERTER

CROSS REFERENCE TO RELATED APPLICATION

The present application claims the benefit of priority to Chinese Patent Application No. CN 2020106957943, entitled "Binary Weighted Current Source and Digital-to-analog Converter", filed with CNIPA on Jul. 20, 2020, the disclosure of which is incorporated herein by reference in its entirety.

FIELD OF TECHNOLOGY

The present disclosure generally relates to circuit design, in particular, to a binary weighted current source and a digital-to-analog converter (DAC).

BACKGROUND

In the field of sensors, there is an increasing need to directly convert extremely small currents into digital signals, for example, in current-controlled analog-to-digital converters with extremely low full-scale reflection currents.

A basic segment in many analog-to-digital (A/D) conversion structures is a digital-to-analog (D/A) converter. The digital-to-analog converter usually includes a binary weighted cell array, including resistors, capacitors, or current sources. Digital signals represented by digital codes turn into corresponding analog voltages or analog currents through a weighted conversion for each bit of the digital codes, and the summing of each bit of analog voltage or analog current results in corresponding analog signals. A digital-to-analog converter whose weight is a power of two is called a binary weighted digital-to-analog converter. A current-controlled digital-to-analog converter uses weighted currents and generates corresponding analog currents at the output.

A binary weighted current source is also required in digital adjustment of a bias current, for example, to compensate for the offset of an analog segment.

As shown in FIG. 1, the U.S. Pat. No. 3,982,172 provides a method to divide a current by 2 through differential transistors with equal control voltages. This method is suitable for currents in the range of 10 microamperes. For currents in the range of hundreds of nanoamps or less, division results of more than 8 bits tend to be imprecise.

As shown in FIG. 2, in prior art, a current can also be divided by 2 through an R-2R ladder network. The resistance value of the resistor on the right side of each node is R. Two resistors of equal resistance are connected in parallel to divide the input current by 2, and binary weighted currents are selected by controlling switches. One factor that constrains the performance of this method is that, for example, the voltage at the output node must be equal to the one at node A as shown in FIG. 2.

SUMMARY

The present disclosure provides a binary weighted current source, which comprises: a driving voltage generating circuit, generating a driving voltage based on a preset current; a current dividing circuit, connected to an output terminal of the driving voltage generating circuit; and a current steering circuit. The current dividing circuit divides the driving voltage through resistors in series, and drives each of a plurality of current output transistors to output a current in response to a voltage across the current output transistor. Currents output by the plurality of current output transistor are binary weighted currents, each two of the binary weighted currents have a binary relationship, and the binary weighted currents are produced by successive binary divisions of the preset current. Each of the binary weighted currents and a voltage cross the corresponding current output transistor have an exponential relationship between them. The current steering circuit is connected to the current dividing circuit and used to control currents passed by the resistors in series.

The present disclosure also provides a digital-to-analog converter, which comprises a binary weighted current source, and a digital-to-analog converting circuit. The binary weighted current source comprises a driving voltage generating circuit, generating a driving voltage based on a preset current; a current dividing circuit, connected to an output terminal of the driving voltage generating circuit; and a current steering circuit. The digital-to-analog converting circuit is connected to the binary weighted current source and produces analog signals based on digital signals and the binary weighted currents

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
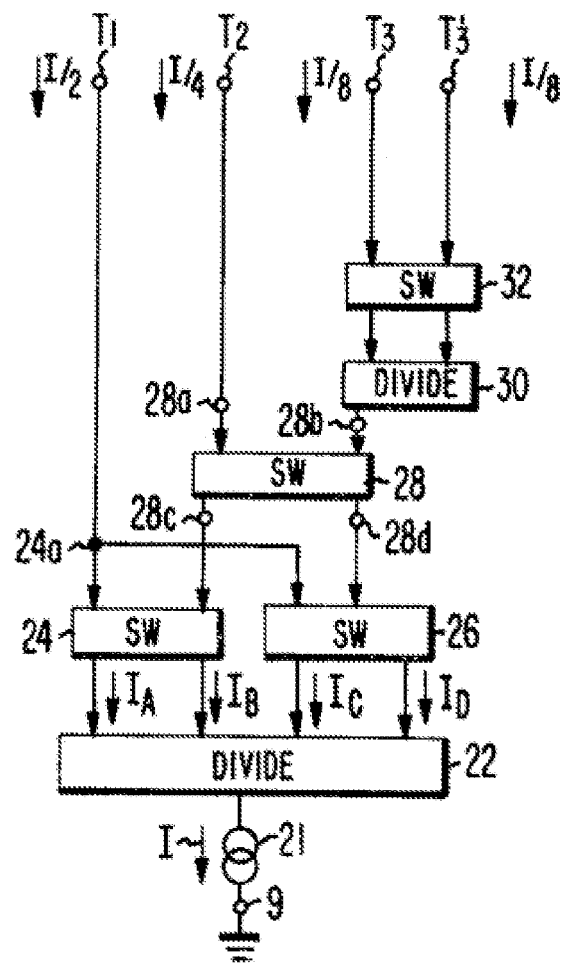
FIG. 1 illustrates a binary weighted current source according to prior art.
Figure 2:
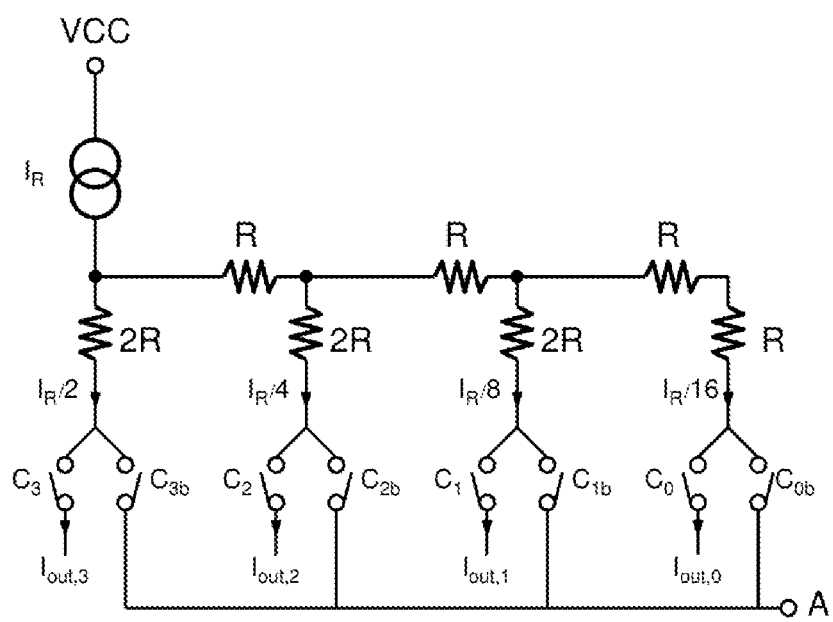
FIG. 2 illustrates another binary weighted current source according to prior art.
Figure 3:
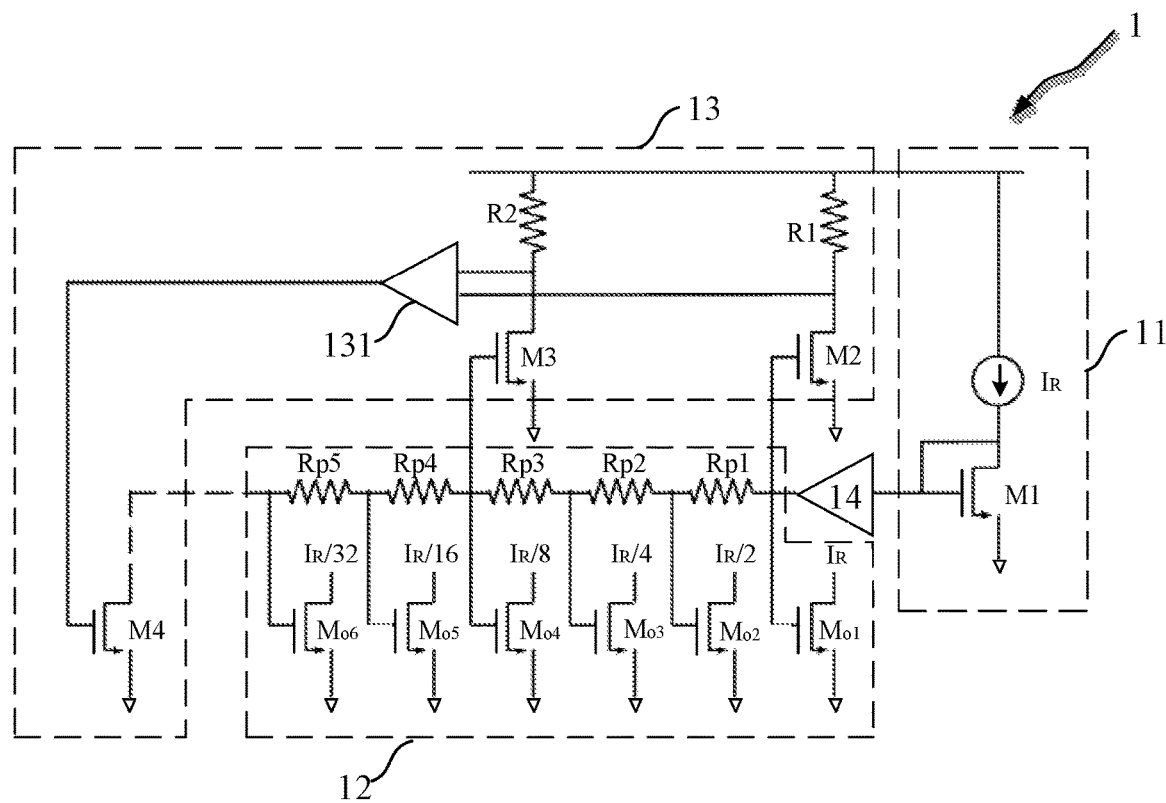
FIG. 3 is a schematic view of a binary weighted current source according to one embodiment of the present disclosure.
Figure 4:
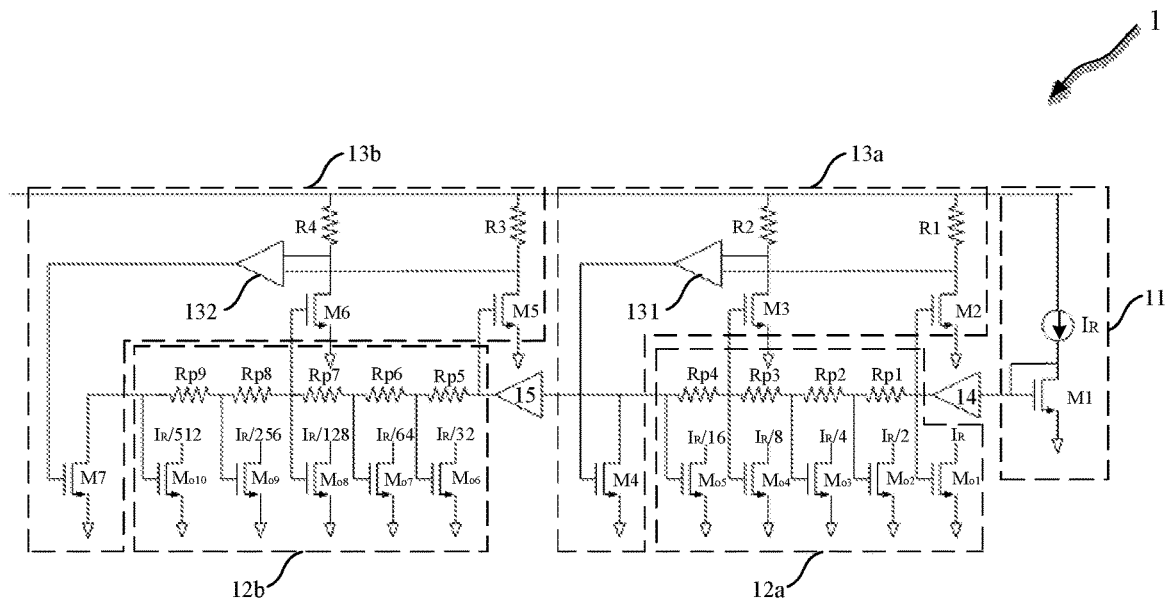
FIG. 4 is a schematic view of a binary weighted current source according to another embodiment of the present disclosure.

For the following disclosure, please refer to FIG. 3 and FIG. 4.

Herein, reference numerals in each figure are only applicable to the corresponding figure, unless otherwise indicated. For the sake of convenience, two same numerals in different figures may represent two items with same or similar properties. For example, "Mo6" in FIG. 3 and "Mo6" in FIG. 4 may represent two transistors, both of which output a binary weighted current, and whose gates are both connected to a terminal of a voltage divider represented by the symbol "Rp5".

The present invention relates to a technology for dividing currents by 2 in the low current ranges of microamperes or nanoamperes, using a logarithmic relationship between voltage and current in a bipolar transistor or a metal oxide semiconductor transistor in a deep subthreshold region, controlling feedback to ensure precise division by $2^k$.

After approximation, the current and the control voltage in a bipolar transistor or a metal oxide semiconductor transistor in a deep sub-threshold region have an exponential relationship as given by:

$$I_C = I_{0B} e^{V_{BE}/V_T}$$

$$I_D = I_{0M} e^{V_{GS}/\eta V_T}$$

Here, $I_C$ is the collector current of the bipolar transistor, $I_{0B}$ is the saturation current, $V_{BE}$ is the base-emitter voltage of the bipolar transistor, $V_T$ is the thermal voltage, $I_D$ is the drain current of the metal oxide semiconductor transistor, $I_{0M}$ is the characteristic current of the metal oxide semiconductor transistor, $V_{GS}$ is the gate-source voltage of the metal oxide semiconductor transistor, and $\eta$ is the subthreshold slope factor (usually $1 < \eta < 3$). When the control voltage (base voltage or gate voltage) of the bipolar transistor or metal oxide semiconductor transistor is successively reduced by $\log_e(2)V_T$ or $\log_e(2)\eta V_T$, the currents are successively divided by 2.

As shown in FIG. 3, the present disclosure provides a binary weighted current source 1. In some embodiments, the binary weighted current source 1 includes: a driving voltage generating circuit 11, a current dividing circuit 12 and a current steering circuit 13. The driving voltage generating circuit 11 produces a driving voltage based on a preset current.

More specially, the driving voltage generating circuit 11 includes a current source $I_R$ and a first transistor M1. The first transistor M1 is connected in a diode form, and the first transistor M1 and the current source $I_R$ are connected in series between a power supply and a reference ground. In some embodiments, the first transistor M1 is NMOS. A first terminal of the current source $I_R$ is connected to the power supply, a second terminal of current source $I_R$ is connected to the drain of the first transistor M1, the gate of the first transistor M1 is connected to the drain of the first transistor M1 and outputs the driving voltage, and the source of the first transistor M1 is grounded.

As shown in FIG. 3, in some embodiments, the binary weighted current source 1 also includes a first buffer 14, and an input terminal of the first buffer 14 is connected to an output terminal of the driving voltage generating circuit 11, and an output terminal of the first buffer 14 is connected to an input terminal of the current dividing circuit 12. In some embodiments, the output terminal of the driving voltage generating circuit 11 is the gate of the first transistor M1. The first buffer 14 replicates the driving voltage. In some embodiments, there is no first buffer 14 in the binary weighted current source 1.

As shown in FIG. 3, the current dividing circuit 12 is connected to the output terminal of the driving voltage generating circuit 11. The current dividing circuit divides the driving voltage through resistors in series, and drives each of one or more current output transistors to output a current in response to a voltage across the current output transistor. Currents output by the one or more current output transistors are binary weighted currents, and each two of the binary weighted currents have a binary relationship, and the binary weighted currents are produced by successive binary divisions of the preset current. Each of the binary weighted currents has an exponential relationship with a voltage cross the corresponding current output transistor that outputs the current.

More specially, in some embodiments, the current dividing circuit 12 includes k voltage dividers and k+1 current output transistors. The k voltage dividers are connected in series, and connected with the output terminal of the first buffer 14. A control terminal of each of the current output transistors is connected to one terminal of one of the k voltage dividers, a first terminal of one of the current output transistors is connected to a preset electrical level, and a second terminal of one of the current output transistors output one of the binary weighted currents. k is a natural number.

In some embodiments, the voltage dividers have substantially the same resistance.

In some embodiments, the one or more current output transistors have substantially the same dimension.

In some embodiments, the one or more current output transistors are NMOS.

In some embodiments, the current dividing circuit 12 includes five voltage dividers, and 6 current output transistors. A first terminal of a first voltage divider Rp1 is connected to the output terminal of the first buffer 14, and a second terminal of the first voltage divider Rp1 is connected to a first terminal of a second voltage divider Rp2. A second terminal of the second voltage divider Rp2 is connected to a first terminal of a third voltage divider Rp3. A second terminal of the third voltage divider Rp3 is connected to a first terminal of a fourth voltage divider Rp4. A second terminal of the fourth voltage divider Rp4 is connected to a first terminal of a fifth voltage divider Rp5. A second terminal of the fifth voltage divider Rp5 is connected to a first terminal of a sixth voltage divider Rp6.

In some embodiments, the source of a first current output transistor Mo1 is connected to the reference ground, the gate of the first current output transistor Mo1 is connected to the first terminal of the first voltage divider Rp1, and the drain of the first current output transistor Mo1 outputs a first current $I_R$. The source of a second current output transistor Mo2 is connected to the reference ground, the gate of the second current output transistor Mo2 is connected to the first terminal of the second voltage divider Rp2, and the drain of the second current output transistor Mo2 outputs a second current $I_R/2$. The source of a third current output transistor Mo3 is connected to the reference ground, the gate of the third current output transistor Mo3 is connected to the first terminal of the third voltage divider Rp3, and the drain of the third current output transistor Mo3 outputs a third current $I_R/4$. The source of a fourth current output transistor Mo4 is connected to the reference ground, the gate of the fourth current output transistor Mo4 is connected to the first terminal of the fourth voltage divider Rp4, and the drain of the fourth current output transistor Mo4 outputs a fourth current $I_R/8$. The source of a fifth current output transistor Mo5 is connected to the reference ground, the gate of the fifth current output transistor Mo5 is connected to the first terminal of the fifth voltage divider Rp5, and the drain of the fifth current output transistor Mo5 outputs a fifth current $I_R/16$. The source of a sixth current output transistor Mo6 is connected to the reference ground, the gate of the sixth current output transistor Mo6 is connected to the second terminal of the fifth voltage divider Rp6, and the drain of the sixth current output transistor Mo6 outputs a sixth current $I_R/32$.

It should be noted that the number of the voltage dividers and the number of the current output transistors can vary depending on needs. In some embodiments, the number of the voltage dividers is within the range of two to ten, and the number of the current output transistors corresponds to the number of voltage dividers in the same binary weighted current source according to their relationship disclosed above.

In some embodiments, the binary weighted currents are at the level of submicron ampere or nanoampere. In some other embodiments, the binary weighted currents are at a higher level (for example, microampere or above).

As shown in FIG. 3, the current steering circuit 13 is connected to the current dividing circuit 12. The current steering circuit 13 controls the amplitude of the current passed by the voltage dividers.

More specially, the current steering circuit 13 includes a second transistor M2, a third transistor M3, a first resistor R1, a second resistor R2, an operational amplifier 131, and a fourth transistor M4. The second transistor M2 and the first resistor R1 are connected in series between the power supply and the reference ground, the third transistor M3 and the second resistor R2 are connected in series between the power supply and the reference ground, an output terminal of the second transistor M2 is connected to a control terminal of one of the one or more current output transistors, an output terminal of the third transistors is connected to a control terminal of one of the one or more current output transistors. Both the second transistor M2 and the third transistor M3 include one or more transistors in parallel. The ratio of the number of transistors in parallel in the third transistor M3 to the number of transistors in parallel in the second transistor M2 is the reciprocal of the ratio of a binary weighted current output by the current output transistor connected with the third transistor M3 to a binary weighted current output by the current transistor connected with the second transistor M2. A first input terminal of the operational amplifier 131 is connected to a connection node of the second transistor M2 and the first resistor R1, and a second input terminal of the operational amplifier 131 is connected to a connection node of the third transistor M3 and the second resistor R2. A first terminal of the fourth transistor M4 is connected to a current output terminal of the voltage dividers, a second terminal of the fourth transistor M4 is grounded, and a control terminal of the fourth transistor M4 is connected to an output terminal of the operational amplifier 131.

In some embodiments, the second transistor M2, the third transistor M3, and the fourth transistor M4 are NMOS. In some embodiments, the source of the second transistor M2 is connected to the reference ground, the gate of the second transistor M2 is connected to the gate of the first current output transistor Mo1, and the drain of the second transistor M2 is connected to the power supply through the first resistor R1. The source of the third transistor M3 is connected to the reference ground, the gate of the third transistor M3 is connected to the gate of the fourth current output transistor Mo4, and the drain of the third transistor M3 is connected to the power supply through the second resistor R2. In some embodiments, the third transistor M3 includes 8 transistors in parallel, the second transistor includes 1 transistor, and the 8 transistors included in the third transistor M3 are of the same size as the transistor M2. The first input terminal of the operational amplifier 131 is connected to the drain of the second transistor M2 and the drain of the third transistor M3. The source of the fourth transistor M4 is connected to the reference ground, the gate of the fourth transistor M4 is connected to the output terminal of the operational amplifier 131, and the drain of the fourth transistor M4 is connected to the second terminal of the fifth voltage divider Rp5.

Through a virtual short of the operational amplifier 131, currents flowing through the voltage dividers are adjusted so that the voltages of the first and second input terminals of the operational amplifier 131 are equal. The first and second input terminals of the operational amplifier 131 are respectively connected to the drain of the second transistor M2 and the drain of the third transistor M3.

The gates of the second transistor M2 and the third transistor M3 may be connected to terminals of any two of the voltage dividers. In some embodiments, the gate of the second transistor M2 is connected to the first terminal of the first voltage divider Rp1, the gate of the third transistor M3 is connected to the first terminal of the third voltage divider Rp3, and the third transistor M3 is four NMOS that have the same size with the second transistor M2. In some embodiments, the gate of the second transistor M2 is connected to the first terminal of the first voltage divider Rp1, the gate of the third transistor M3 is connected to the first terminal of the fifth voltage divider Rp5, and the third transistor M3 is sixteen NMOS that have the same size with the second transistor M2. The number of transistors included in the second transistor M2 and the number of transistors included in the third transistor M3 can be determined by their relationship disclosed herein. As discussed above, in some embodiments, the ratio of the number of transistors in parallel in the third transistor M3 to the number of transistors in parallel in the second transistor M2 is the reciprocal of the ratio of a binary weighted current output by the current output transistor connected with the third transistor M3 to a binary weighted current output by the current transistor connected with the second transistor M2.

In some embodiments, the first transistor M1, the one or more current output transistors, the second transistor M2, the third transistor M3, and the fourth transistor M4 are NPN bipolar transistors. Connections between the terminals are adjusted accordingly.

In some embodiments, the first transistor M1, the one or more current output transistors, the second transistor M2, and the third transistor M3 are PMOS, and the present electrical level is the power supply. Connections between the terminals are adjusted accordingly.

In some embodiments, the first transistor M1, the one or more current output transistors, the second transistor M2, and the third transistor M3 are NPN bipolar transistors, and the present electrical level is the power supply. Connections between the terminals are adjusted accordingly.

Turning to FIG. 4, in some embodiments, the binary weighted current source 1 includes several cascaded current dividing circuits.

In some embodiments, a current dividing circuit following a first current dividing circuit includes the same number of voltage dividers and current output transistors, and the first current dividing circuit is a current dividing circuit connected to the driving voltage generating circuit 11 through the buffer 14.

More specially, as shown in FIG. 4, in some embodiments, the binary weighted current source 1 includes a first current dividing circuit 12a, a driving voltage generating circuit 11, a first current steering circuit 13a, a second current dividing circuit 12b, and a second current steering circuit 13b.

Referring to FIG. 4, in some embodiments, the first current dividing circuit 12a includes a first voltage divider Rp1, a second voltage divider Rp2, a third voltage divider Rp3, and a fourth voltage divider Rp4. In some embodiments, the first current dividing circuit 12a includes a first current output transistor Mo1, a second current output transistor Mo2, a third current output transistor Mo3, a fourth current output transistor Mo4, and a fifth current output transistor Mo5.

Referring to FIG. 4, in some embodiments, the first current steering circuit 13a includes a second transistor M2, a third transistor M3, and a fourth transistor M4. In some embodiments, the first current steering circuit 13a includes a first resistor R1, a second resistor R2, and an operational amplifier 131.

Referring to FIG. 4, in some embodiments, the second current dividing circuit 12b includes a fourth voltage divider Rp5, a sixth voltage divider Rp6, a seventh voltage divider Rp7, an eighth voltage divider Rp8, and a ninth voltage divider Rp9. In some embodiments, the second current dividing circuit 12b includes a sixth current output transistor Mo6, a seventh current output transistor Mo7, an eighth current output transistor Mo8, a ninth current output transistor Mo9, and a tenth current output transistor Mo10.

Referring to FIG. 4, in some embodiments, the second current steering circuit 13b includes a fifth transistor M5, a sixth transistor M6, a seventh transistor M7, a third resistor R3, a fourth R4, and a second operational amplifier 132.

Referring to FIG. 4, in some embodiments, the first current dividing circuit 12a is connected to an output terminal of the driving voltage generating circuit 11; the first current steering circuit 13a is connected to the first current dividing circuit 12a and controls currents flowing through the voltage dividers in the first current dividing circuit 12a; the second current dividing circuit 12b is connected to a second terminal of the fourth voltage divider Rp4 in the first current dividing circuit 12a; the second current steering circuit 13b is connected to the second current dividing circuit 12b and controls currents flowing through the voltage dividers in the second current dividing circuit 12b.

Referring to FIG. 4, the current output transistors Mo1, Mo2, Mo3, Mo4, and Mo5 outputs binary weighted currents $I_R$, $I_R/2$, $I_R/4$, $I_R/8$, and $I_R/16$ respectively. The current output transistors Mo6, Mo7, Mo8, Mo9, and Mo10 outputs binary weighted currents $I_R/32$, $I_R/64$, $I_R/128$, $I_R/256$, and $I_R/512$ respectively.

Referring to FIG. 4, in some embodiments, the first current dividing circuit 12a and the second current dividing circuit 12b have the same structure. In some embodiments, the first current dividing circuit 12a and the second current dividing circuit 12b have different structures. In some embodiments, the first current steering circuit 13a and the second current steering circuit 13b have the same structure. In some embodiments, the first current steering circuit 13a and the second current steering circuit 13b have different structures.

Referring to FIG. 4, in some embodiments, there is a second buffer 15 between the first current dividing circuit 12a and the second current dividing circuit 12b. The second buffer 15 helps to ensure precise output of the binary weighted currents.

The present disclosure also provides a digital-to-analog converter, which includes a binary weighted current source; and a digital-to-analog converting circuit connected to the binary weighted current source. The binary weighted current course is one of the embodiments of a binary weighted current source disclosed above.

More specially, in some embodiments, as shown in FIG. 3, the binary weighted current source includes a driving voltage generating circuit 11, a current dividing circuit 12 and a current steering circuit 13.

In some embodiments, as shown in FIG. 4, the binary weighted current source includes a first current dividing circuit 12a, a driving voltage generating circuit 11, a first current steering circuit 13a, a second current dividing circuit 12b, and a second current steering circuit 13b.

In some embodiments, the digital-to-analog converting circuit is connected to the binary weighted current source and produces analog signals based on digital signals and binary weighted currents output by the binary weighted current source.

In some embodiments, the digital-to-analog converter is a binary digital-to-analog converter. In some embodiments, the digital-to-analog converter is a decimal digital-to-analog converter. In some embodiments, the digital-to-analog converter is an octal digital-to-analog converter. In some embodiments, the digital-to-analog converter is a hexadecimal digital-to-analog converter.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

LIST OF REFERENCE NUMERALS 1 binary weighted current source
11 driving voltage generating circuit
12 current dividing circuit
12a first current dividing circuit
12b second current dividing circuit
13 current steering circuit
13a first current steering circuit
13b second current steering circuit
131, 132 operational amplifier
14 first buffer
15 second buffer

We claim:
1. A binary weighted current source, comprising:
a driving voltage generating circuit, generating a driving voltage based on a preset current;
a current dividing circuit, connected to an output terminal of the driving voltage generating circuit,
wherein the current dividing circuit divides the driving voltage through resistors in series, and drives each of a plurality of current output transistors to output a current in response to a voltage across the current output transistor,
wherein currents output by the plurality of current output transistor are binary weighted currents, each two of the binary weighted currents have a binary relationship, and the binary weighted currents are produced by successive binary divisions of the preset current,
wherein each of the binary weighted currents and a voltage cross the corresponding current output transistor have an exponential relationship between them;
a current steering circuit, connected to the current dividing circuit and used to control currents passed by the resistors in series, a plurality of current dividing circuits, wherein the plurality of current dividing circuits are cascaded in sequence; and a plurality of current steering circuits, wherein each of the plurality of current steering circuits corresponds to one of the plurality of current dividing circuits.

2. The binary weighted current source according to claim 1, wherein the driving voltage generating circuit includes a current source and a first transistor, wherein the first transistor is connected in a diode form, wherein the first transistor and the current source are connected in series between a power supply and a reference ground.

3. The binary weighted current source according to claim 2, wherein the first transistor is one of NMOS, PMOS, NPN, and PNP.

4. The binary weighted current source according to claim 1, wherein each of the binary weighted currents is at the microampere level or nanoampere level.

5. The binary weighted current source according to claim 1,
wherein the current dividing circuit includes k voltage dividers and k+1 current output transistors,
wherein the k voltage dividers are connected in series and connected with the output terminal of the driving voltage generating circuit,
wherein a control terminal of one of the k+1 current output transistors is connected to a terminal of one of the k voltage dividers, a first terminal of one of the k+1 current output transistors is connected to a preset electrical level, and a second terminal of one of the k+1 current output transistors outputs one of the binary weighted currents,
wherein the k voltage dividers have substantially the same resistance,
wherein the k+1 current output transistors have substantially the same size,
wherein k is a natural number.

6. The binary weighted current source according to claim 5, wherein the k+1 current output transistors are NMOS or NPN, and the preset electrical level is the reference ground.

7. The binary weighted current source according to claim 5,
wherein the current steering circuit includes a second transistor, a third transistor, a first resistor, a second resistor, an operational amplifier, and a fourth transistor,
wherein the second transistor and the first resistor are connected in series between the power supply and the reference ground, a control terminal of the second transistor and a control terminal of one of the k+1 current output transistors are connected, a control terminal of the third transistor and a control terminal of one of the k+1 current output transistors are connected, and the ratio of the number of transistors in parallel in the third transistor to the number of transistors in parallel in the second transistor is the reciprocal of the ratio of a binary weighted current output by the current output transistor connected with the third transistor to a binary weighted current output by the current transistor connected with the second transistor,
wherein an input terminal of the operational amplifier is connected to a connection node of the second transistor and the first resistor, and a connection node of the third transistor and the second resistor,
wherein a first terminal of the fourth transistor is connected to a current output terminal of the k voltage dividers, a second terminal of the fourth transistor is grounded, and a control terminal of the fourth transistor is connected to an output terminal of the operational amplifier.

8. The binary weighted current source according to claim 7, wherein the second transistor, the third transistor and the k+1 current output transistors are of the same type of transistors, wherein the fourth transistor is NMOS or NPN.

9. The binary weighted current source according to claim 1, wherein a buffer is placed between the output terminal of the driving voltage generating circuit and an input terminal of the current dividing circuit.

10. The binary weighted current source according to claim 1, wherein a current dividing circuit following a first current dividing circuit includes the same number of voltage dividers and current output transistors, wherein the first current dividing circuit is a current dividing circuit connected to the driving voltage generating circuit through a buffer.

11. The binary weighted current source according to claim 1, wherein there is a buffer between two neighboring current dividing circuits.

12. A digital-to-analog converter, including:
a binary weighted current source, including:
a driving voltage generating circuit, generating a driving voltage based on a preset current;
a current dividing circuit, connected to an output terminal of the driving voltage generating circuit,
wherein the current dividing circuit divides the driving voltage through resistors in series, and drives each of a plurality of current output transistors to output a current in response to a voltage across the current output transistor,
wherein currents output by the plurality of current output transistor are binary weighted currents, each two of the binary weighted currents have a binary relationship, and the binary weighted currents are produced by successive binary divisions of the preset current,
wherein each of the binary weighted currents and a voltage cross the corresponding current output transistor have an exponential relationship between them;
a current steering circuit, connected to the current dividing circuit and used to control currents passed by the resistors in series;
a plurality of current dividing circuits, wherein the plurality of current dividing circuits are cascaded in sequence; and
a plurality of current steering circuits, wherein each of the plurality of current steering circuits corresponds to one of the plurality of current dividing circuits; and
a digital-to-analog converting circuit, wherein the digital-to-analog converting circuit is connected to the binary weighted current source and produces analog signals based on digital signals and the binary weighted currents.

* * * * *